US007521756B2

(12) United States Patent
Dietz et al.

(10) Patent No.: US 7,521,756 B2
(45) Date of Patent: Apr. 21, 2009

(54) DMOS TRANSISTOR WITH OPTIMIZED PERIPHERY STRUCTURE

(75) Inventors: Franz Dietz, Untereisesheim (DE); Michael Graf, Leutenbach (DE); Stefan Schwantes, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 22 days.

(21) Appl. No.: 11/636,668

(22) Filed: Dec. 11, 2006

(65) Prior Publication Data

US 2007/0132019 A1    Jun. 14, 2007

(30) Foreign Application Priority Data

Dec. 9, 2005    (DE) .................. 10 2005 060 521

(51) Int. Cl.
*H01L 29/76* (2006.01)
(52) U.S. Cl. .................. 257/335; 257/343; 257/336; 257/337; 257/338; 257/339; 257/340; 257/341; 257/342
(58) Field of Classification Search ......... 257/335–343, 257/E29.027, E29.256
See application file for complete search history.

(56) References Cited

U.S. PATENT DOCUMENTS 6,441,432 B1    8/2002    Sumida 6,593,621 B2    7/2003    Tsuchiko et al.
7,091,556 B2    8/2006    Edwards et al.
2003/0038316 A1    2/2003    Tsuchiko et al.
2005/0145930 A1    7/2005    Edwards et al.

FOREIGN PATENT DOCUMENTS

EP    1 286 399 A2    2/2003

OTHER PUBLICATIONS

Ravishankar Sunkavalli et al., "High Temperature Performance of Dielectrically Isolated LDMOSFET: Characterization, Simulation and Analysis", Proceedings of the International Symposium on Power Semiconductor Devices, May 31, 1994, pp. 359-364.

*Primary Examiner*—Sue Purvis
*Assistant Examiner*—Tucker Wright
(74) *Attorney, Agent, or Firm*—Muncy, Geissler, Olds & Lowe, PLLC

(57) ABSTRACT

A lateral DMOS transistor is disclosed that includes a first region of a first conductivity type, which is surrounded on the sides by a second region of a second conductivity type, whereby a boundary line between both regions has opposite straight sections and curved sections linking the straight sections, and with a first dielectric structure, which serves as a field region and is embedded in the first region and surrounds a subregion of the first region. Whereby the first distance between the first dielectric structure and the boundary line is greater along the straight sections than along the curved sections.

10 Claims, 1 Drawing Sheet

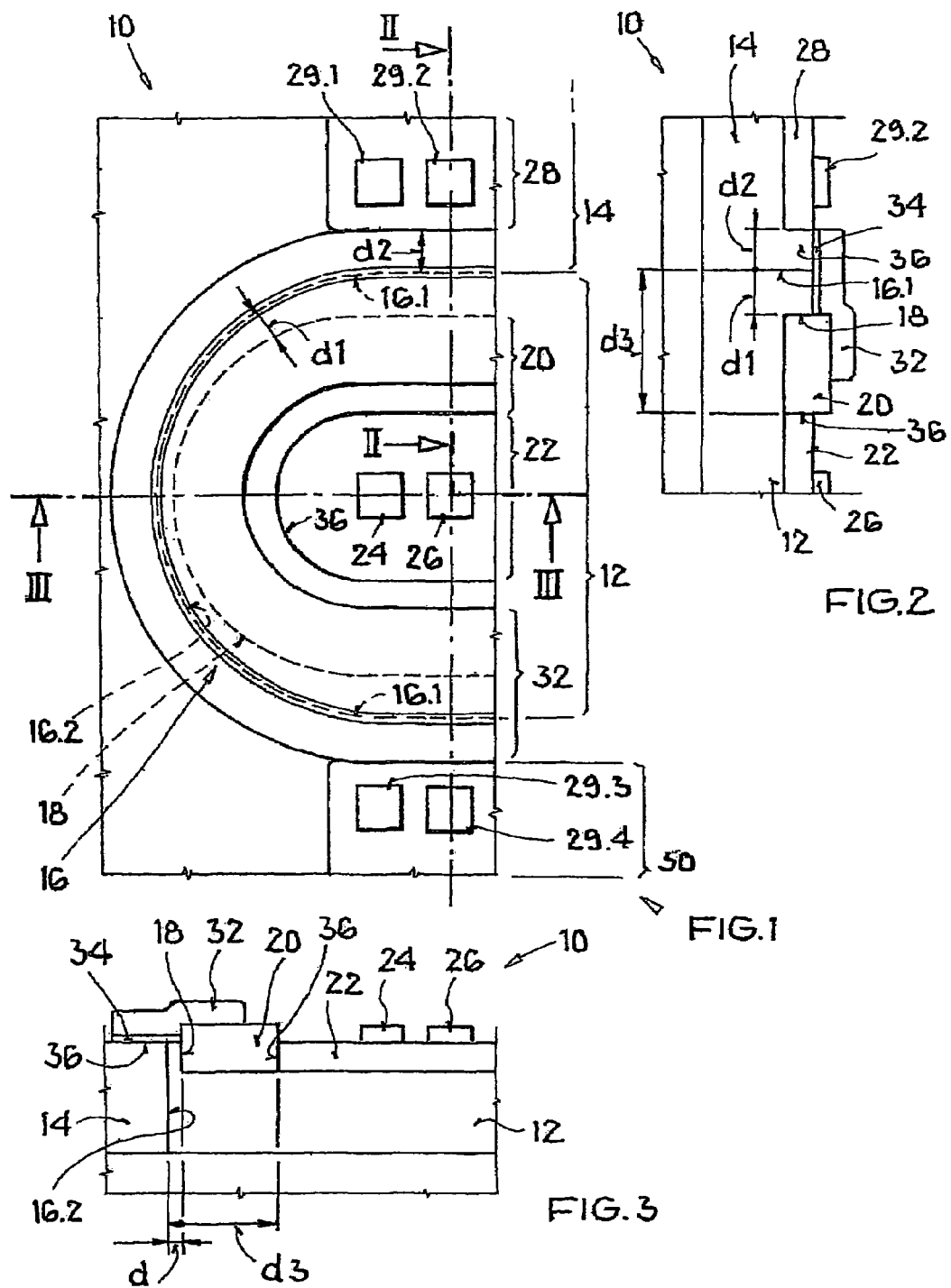

DMOS TRANSISTOR WITH OPTIMIZED PERIPHERY STRUCTURE

This nonprovisional application claims priority under 35 U.S.C. § 119(a) on German Patent Application No. DE 102005060521, which was filed in Germany on Dec. 9, 2005, and which is herein incorporated by reference.

BACKGROUND OF THE INVENTION

1. Field of the Invention

The present invention relates to a lateral DMOS transistor.

2. Description of the Background Art

A DMOS transistor is understood to be a field-effect transistor with a source region, a channel region, and a drain region, in which the drain region is separated from the channel region by a drift region. Whereas the conductivity of the channel region is controlled by a gate voltage, by which an occurrence and strength of an inversion of the concentrations of positive or negative charge carriers below the gate are controlled, the charge carrier concentration in the drift region is substantially constant, so that in approximate terms an ohmic conductivity results there. The voltage drop occurring during the operation of the transistor across the drift region reduces the portion of the drain-source voltage, emerging via the channel, which leads to an increased transistor breakdown voltage.

In a lateral DMOS transistor, the current flow and the channel region are oriented substantially parallel to the surface of the wafer, whereas in a vertical DMOS transistor it is oriented substantially in direction of a perpendicular to the wafer surface. The lateral DMOS transistor can therefore be contacted from one side, whereas the vertical DMOS transistor must be connected from two sides of the wafer.

DMOS transistors are frequently used as driver transistors for driving inductive loads, particularly in the automotive field, and should have as high a breakdown voltage as possible with a simultaneously minimal space requirement. To avoid edges and corners where locally undesirably high field strengths could arise due to the electrical peak effect, it is known per se to produce DMOS transistors with the aforementioned features and thereby with a stadium structure. In the conventional stadium structure, a distance between the first dielectric structure, which is generally called a field region, and the boundary line along the straight sections is precisely as large as along the curved sections. Although high breakdown voltages can already be realized with a small size with use of stadium structures, the need continues to exist for further optimization of the relation between breakdown voltage and size, in order to further reduce the area of the DMOS transistors and to lower manufacturing costs.

In an alternative approach, a lithographic patterning of the drift region in the curved peripheral regions was used to reduce the doping in these areas. However, element simulations and electrical measurements have shown that the breakdown voltage of the drift region is optimal at a specific doping and declines for higher and lower dopings. This depends on the so-called RESURF (Reduced Surface Field) effect, which contributes substantially to a high breakdown voltage of the element. This effect cannot be utilized optimally both for too low and too high dopings of the drift region.

SUMMARY OF THE INVENTION

It is therefore an object of the present invention to provide a DMOS transistor structure with an improved relation between breakdown voltage and size.

This object is achieved in a DMOS transistor in that a distance between the first dielectric structure, i.e., the field region, and the boundary line is greater along the straight sections than along the curved sections.

It turned out that under comparable conditions lower field strengths occur in the structure according to an embodiment of the invention than in the conventional stadium structure. Because in the conventional stadium structure, the higher field strengths therein more greatly limited the breakdown voltage, the structure according to the invention has a higher breakdown voltage with the same size or a smaller size with the same breakdown voltage. Thus, for example, with a reduction of the distance from an initial value from 0.9 µm to 0.6 µm, an increase in the breakdown voltage from about 65 V to about 83 V resulted and with a further reduction to 0.3 µm an increase to about 88 V.

In this case, it is preferable that the distance changes steadily. With this feature, counterproductive corners or edges are avoided where known excessive field strengths occur (peak effect).

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 is a top plan view of a portion of a lateral DMOS transistor, according to an embodiment of the present invention;

FIG. 2 shows a first section through the DMOS transistor of FIG. 1; and

FIG. 3 shows a second section through the DMOS transistor of FIG. 1.

DETAILED DESCRIPTION

FIG. 1 shows a left half of a lateral DMOS transistor 10, which has straight and curved regions, which together produce a shape that resembles the shape of a stadium or a track of a stadium. A first region 12, made of semiconductor material of a first conductivity type, forms an inner region, which is surrounded on sides by a second outer region 14, made of semiconductor material of a second conductivity type. This is also illustrated by FIGS. 2 and 3. In the diagram of FIGS. 1 to 3, the semiconductor material of the first conductivity type has a p-conductivity and the semiconductor material of the second conductivity type has an n-conductivity. A boundary line 16, shown as a dashed line in FIG. 1, marks the boundary between first region 12 and second region 14. In this case, boundary line 16 has straight sections 16.1 and curved sections 16.2.

Another dashed line marks an outer boundary 18 of a first dielectric structure 20, which is embedded in first inner region 12. First dielectric structure 20, which is also called a field region or isolation region, can be realized, for example, as a shallow trench isolation (STI). A first distance dl between dielectric structure 20 and boundary line 16 is greater along the straight sections 16.1 than along the curved section 16.2. The first dielectric structure surrounds a subregion 22 of first region 12, which is more highly doped than the rest of first region 12. This subregion 22 during operation of transistor 10 serves as a drain region and has highly conductive terminal contacts 24, 26, which can be made of, for example, metal or polysilicon.

Along straight sections 16.1, strip-shaped regions 28, 30 of the first conductivity type extend at a second distance d2 to boundary line 16. Strip-shaped regions 28, 30 are preferably more highly doped than the first region and the second region, and function as source regions during the operation of transistor 10. Therefore, they also have highly conductive terminal contacts 29.1, 29.2, 29.3, and 29.4.

There is a layer 32, made of highly conductive material and extending up to the strip-shaped source regions 28, 30, on top of the first dielectric structure. It thereby also covers a thin second dielectric layer-shaped structure, which serves as a gate dielectric and lies between first dielectric structure 20 and strip-shaped regions 28, 30.

The second dielectric structure, serving as a gate layer, gate oxide, or gate dielectric, is labeled with the number 34 in the cross sections of FIGS. 2 and 3. Otherwise, the same numbers designate the same elements in FIGS. 1 through 3.

A channel region 36, which is covered by second dielectric structure 34, extends between the strip-shaped regions 28, 30 and boundary line 16. Second dielectric structure 34, serving as the gate oxide, is thinner than first dielectric structure 20, forming the field region, and merges into first dielectric structure 20. In this case, second dielectric structure 34 completely surrounds first dielectric structure 20 and in all areas extends beyond boundary line 16. At the appropriate potential of gate electrode 32, which lies on second dielectric layer 34 serving as a gate oxide, there is an inversion of the charge carrier concentrations in the channel region, as a result of which a continuous path of the first conductivity type forms between source region 28 and drain region 22. The portion of first region 12 lying in the path between drain region 22 and the channel region, forms the drift region.

As is evident from all FIGS. 1, 2, and 3, first distance d1 between first dielectric structure 20 and boundary line 16 along straight sections 16.1 is greater than along curved sections 16.2. These relations can be produced, for example, in that a width of first dielectric structure 20 along straight sections 16.1 is smaller than or equal to its width along curved sections 16.2, and a third distance d3 between boundary line 16 and an inner edge 36 of first dielectric structure 20 is smaller along curved sections 16.2 than along straight sections 16.1. With the same width, therefore, the boundary line approaches inner edge 36 more closely in the curved region than along straight sections 16.1. Alternatively, third distance d3 between inner edge 36 and boundary line 16 can also be constant, however, if first dielectric structure 20 is widened in the curved region.

In view of FIGS. 1 through 3, the invention was illustrated using the example of a p-channel DMOS transistor. It is understood, however, that the invention can also be realized with an n-channel DMOS. In this case, the realization of an n-channel DMOS is to use an n-conducting semiconductor material as a semiconductor material of the first conductivity type and a p-conducting semiconductor material as a semiconductor material of the second conductivity type. During operation of an n-channel DMOS, a positive potential is to be applied to the gate electrode to form an n-channel region below the gate oxide between the drain electrode and the source electrode in the path of the inversion layer formation.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is

1. A lateral DMOS transistor comprising:
   a first region having a first conductivity type;
   a second region having a second conductivity type;
   the first region being surrounded on a side thereof by said second region;
   a boundary line formed between the first region and the second region has opposite straight sections and at least partially curved sections linking the straight sections; and
   a first dielectric field region embedded in the first region and surrounding a subregion of the first region;
   wherein a first distance between the first dielectric field region and the boundary line is greater along the straight sections than along the curved sections.

2. The lateral DMOS transistor according to claim 1, wherein changes in the first distance occur smoothly without corners or edges.

3. The lateral DMOS transistor according to claim 1, wherein a width of the first dielectric field region along the straight sections is smaller than or equal to its width along the curved sections, and wherein a third distance between the boundary line and an inner edge of the first dielectric field region is smaller along the curved sections than along the straight sections.

4. The lateral DMOS transistor according to claim 1, further comprising strip-shaped regions having the first conductivity type, extending along the straight sections at a second distance to the boundary line forming a channel region between said strip-shaped regions and said first dielectric field region.

5. The lateral DMOS transistor according to claim 4, wherein the strip-shaped regions are more highly doped than the first region and/or the second region.

6. The lateral DMOS transistor according to claim 4, wherein the channel region is covered by a second gate dielectric, which is thinner than the first dielectric field region serving as the field region and merges into the first dielectric field region.

7. The lateral DMOS transistor according to claim 6, wherein the second gate dielectric substantially completely surrounds the first dielectric field region and in all areas extends beyond the boundary line.

8. The lateral DMOS transistor according to claim 1, wherein the subregion is surrounded by the first dielectric field region and is more highly doped than the first region.

9. The lateral DMOS transistor according to claim 1, wherein the first conductivity type is a p-conductivity and the second conductivity type is an n-conductivity.

10. The lateral DMOS transistor according to claim 1, wherein the first conductivity type is an n-conductivity and the second conductivity type is a p-conductivity.

* * * * *